United States Patent
Freitag et al.

(10) Patent No.: US 7,061,729 B2
(45) Date of Patent: Jun. 13, 2006

(54) PROTECTIVE CAP IN LEAD OVERLAY MAGNETIC SENSORS

(75) Inventors: James Mac Freitag, San Jose, CA (US); Mustafa Pinarbasi, Morgan Hill, CA (US); Patrick Rush Webb, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 10/150,314

(22) Filed: May 16, 2002

(65) Prior Publication Data

US 2003/0214761 A1    Nov. 20, 2003

(51) Int. Cl.
  *G11B 5/39*    (2006.01)
(52) U.S. Cl. .................... 360/322; 360/324.1
(58) Field of Classification Search ............ 360/322, 360/324.12, 324.11
  See application file for complete search history.

(56) References Cited

U.S. PATENT DOCUMENTS

| | | | |
|---|---|---|---|
| 6,208,491 B1 | 3/2001 | Pinarbasi | 360/324.1 |
| 6,268,985 B1 | 7/2001 | Pinarbasi | 360/324.12 |
| 6,331,773 B1 | 12/2001 | Engel | 324/252 |
| 6,580,587 B1 * | 6/2003 | Everitt | 360/324 |
| 6,594,124 B1 * | 7/2003 | Zheng et al. | 360/324.12 |
| 2001/0026424 A1 * | 10/2001 | Kamata et al. | 360/322 |
| 2002/0093773 A1 * | 7/2002 | Pinarbasi | 360/322 |
| 2002/0154453 A1 * | 10/2002 | Ikeda | 360/322 |
| 2002/0154458 A1 * | 10/2002 | Lin et al. | 360/324.12 |
| 2003/0128481 A1 * | 7/2003 | Seyama et al. | 360/324.1 |
| 2003/0169541 A1 * | 9/2003 | Dovek et al. | 360/324.1 |
| 2005/0180057 A1 * | 8/2005 | Freitag et al. | 360/324.1 |

FOREIGN PATENT DOCUMENTS

| | | | | |
|---|---|---|---|---|
| JP | 62115790 A | * | 5/1987 |
| JP | 07093719 A | * | 4/1995 |
| JP | 2001034917 A | * | 2/2001 |
| JP | 2002076470 A | * | 3/2002 |

* cited by examiner

*Primary Examiner*—William J Klimowicz
(74) *Attorney, Agent, or Firm*—Zilka-Kotab, PC

(57) ABSTRACT

A lead overlay magnetic sensor for use in a disk drive is provided having a protective cap layer disposed between the electrical leads and the sensor. The protective cap layer is preferably formed from ruthenium, rhodium, or other suitable material. The sensors thus formed have low resistance between the electrical leads and the sensor and also have well defined magnetic trackwidths.

21 Claims, 6 Drawing Sheets

PROTECTIVE CAP IN LEAD OVERLAY MAGNETIC SENSORS

BACKGROUND OF THE INVENTION

1. Field of the Invention

The present invention relates in general to a magnetic sensor used in a magnetic disk drive and more specifically to an improved lead overlay magnetic sensor.

2. Description of the Background Art

Disk drives using magnetic recording of digital information are used to store most of the information in contemporary computer systems. A disk drive typically has a housing with at least one rotatable magnetic disk having a plurality of concentric tracks of magnetically stored data. There is at least one recording head typically with a separate write element and read element for writing and reading data on the tracks. The recording head is constructed on a slider and the slider is attached to a suspension. The suspension is connected to an actuator which positions the recording head over a specific track of interest. The actuator first rotates to seek the track of interest and after positioning the recording head over that track maintains the recording head in close registration to that track.

The read element in most disk drives is a sandwich structure of thin films in which the resistance is modulated by spin dependent electron transport. One common configuration of a read element is a current-in-plane (CIP) spin valve design. Another configuration of a read element is a current-perpendicular-to-plane (CPP) magnetic tunnel junction design. In general, read elements have a pinned ferromagnetic structure in close proximity to a free ferromagnetic layer. The direction of magnetization in the pinned ferromagnetic layer is fixed, or pinned, in a specified direction by an adjoining antiferromagnetic layer. The direction of magnetization in the free layer is responsive to the external magnetic field to which the read element is subjected. The magnetization in the free layer is usually partially stabilized with adjacent permanent magnets. The relative directions of the magnetization in the pinned layer and the free layer determines the resistance of the read element. Usually, tantalum is used in the uppermost layer in the read element sandwich structure to protect the other materials.

The recording density of digital information for each new generation of disk drive products is usually higher than for the previous generation. Thus, each new read element is generally required to be smaller and more sensitive. Lead overlay read elements have been developed to achieve smaller sensors with greater sensitivity. In lead overlay read elements the electrical leads overlap portions of the sandwich of layers in the sensor. This structure has at least two advantages. One, the magnetic trackwidth is defined primarily by the distance between the two leads. The second advantage of lead overlay read elements is that the less sensitive regions of the sensor adjacent to the permanent magnets are de-emphasized.

One problem with the lead overlay read element is that after deposition the tantalum layer tends to oxidize during subsequent processing. This oxidation layer can cause poor electrical connection (high contact resistance) between the layers in the sensor and the leads. This poor electrical connection can lead to a magnetic trackwidth which is substantially wider than the width defined by the leads. High contact resistance between the leads and the sensor also increases the overall sensor resistance resulting in poor recording performance.

From the foregoing it is apparent that an improved lead overlay magnetic sensor is needed with very low resistance between the leads and the sensor.

SUMMARY OF THE INVENTION

In a preferred embodiment, the invention provides a protective cap layer disposed between the leads and the sensor. The protective cap layer may be a suitable material such as ruthenium and rhodium and preferably has a thickness greater than 10 Å. The protective cap layer prevents oxidation of the surface of the uppermost layer in the sensor and thus provides for excellent electrical conduction from the sensor to the leads. A read element having the invented protective cap layer has low resistance and a well defined magnetic trackwidth.

In another embodiment of the invention, a disk drive is provided wherein the read element has a sensor, electrical leads connected with the sensor, and a protective cap layer disposed between the sensor and the electrical leads.

Other aspects and advantages of the present invention will become apparent from the following detailed description, which along with the accompanying figures illustrate by way of example the principles of the invention.

DETAILED DESCRIPTION OF THE INVENTION

In a preferred embodiment, the invention provides a protective cap layer disposed between the electrical leads and the sensor in a lead overlay read element used in magnetic recording. Embodiments of the invention provide read elements having low resistance between the leads and the sensor and also have well defined magnetic trackwidths.

Figure 1:
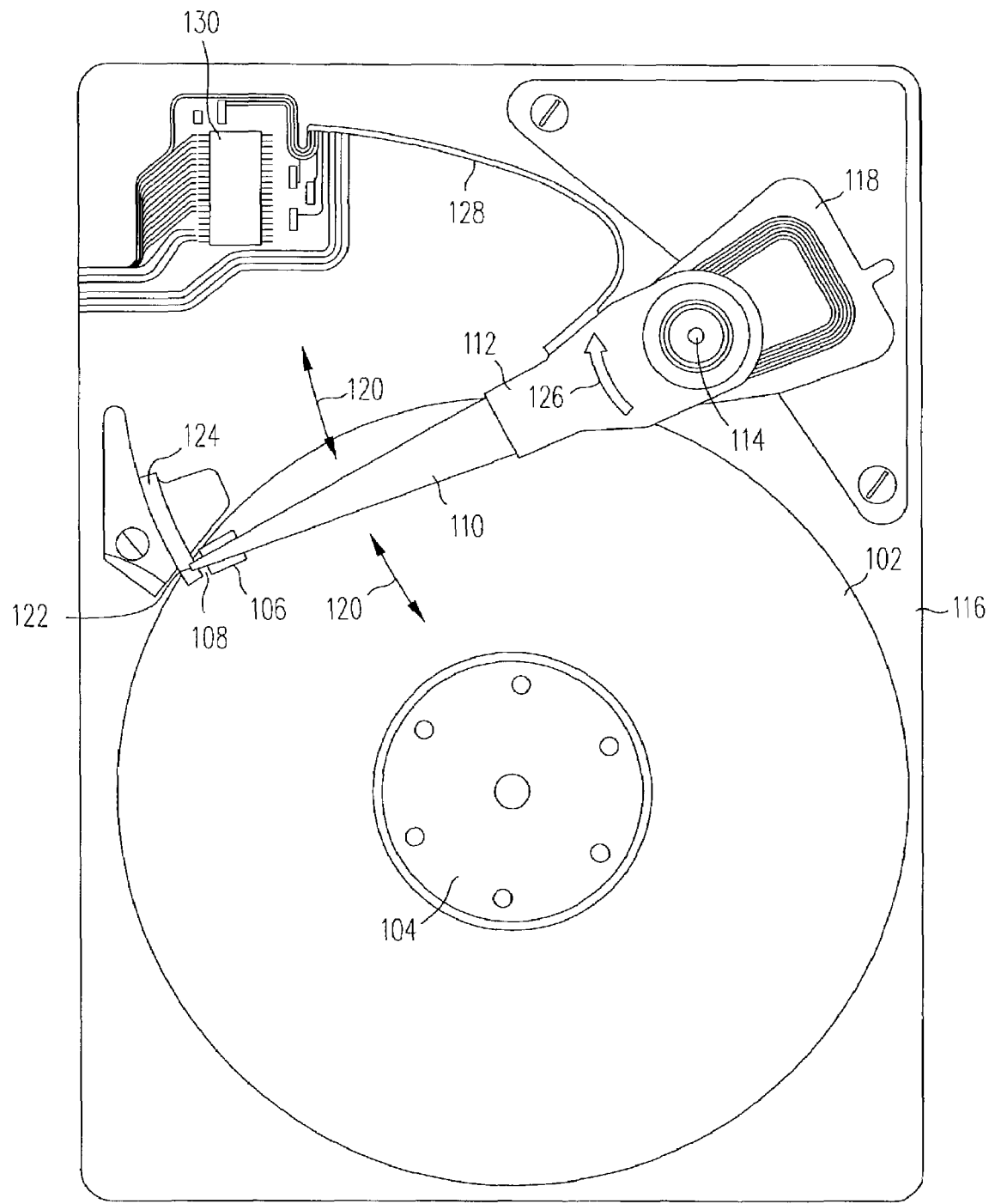
FIG. 1 illustrates a view of a disk drive.

Referring to FIG. 1, a magnetic disk drive 100 has at least one rotatable magnetic disk 102 supported by a spindle 104 and rotated by a motor (not shown). There is at least one slider 106 with an attached recording head 108 positioned over the disk 102 surface while reading and writing. The slider 106 is attached to a suspension 110 and the suspension 110 is attached to an actuator 112. The actuator 112 is pivotally attached 114 to the housing 116 of the disk drive 100 and is driven by a voice coil motor 118. As the disk 102 is rotating, the slider 106 along with the suspension 110 is positioned by the actuator 112 radially or along an arcuate path 120 over the disk 102 surface to access the data track of interest.

Typically, during operation of the disk drive 100, the motion of the rotating disk 102 relative to the slider 106 generates an air bearing between the slider 106 and the disk 102 surface which exerts an upward force on the slider 106. This force is balanced by a spring force from the suspension 110 urging the slider 106 toward the surface of the disk 102. Alternatively, the slider 106 may be in either partial or continuous contact with the disk 102 surface during operation.

FIG. 1 also shows a load/unload tab 122 on the distal end of the suspension 110. This load/unload tab 122 operates in conjunction with a load/unload fixture 124 to lift the slider 106 away from the disk 102 surface when the disk drive 100 is turned off or goes into a power saving mode. When an unload operation is initiated, the actuator 112 rotates far enough in a clockwise direction 126 such that the load/unload tab 122 engages with the load/unload fixture 124. The load/unload tab 122 then slides up the load/unload fixture 124 gently lifting the slider 106 off of the disk 102 surface. FIG. 1 also shows the electrical connection 128 as wires or a flex cable between the recording head 108 and the preamplifier 130.

Figure 2A:
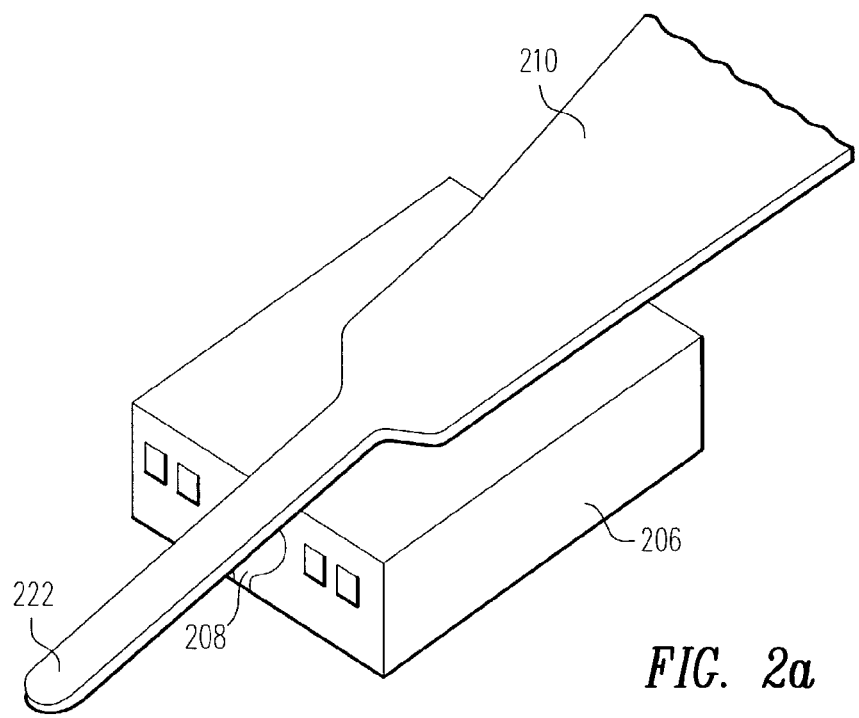
FIG. 2a illustrates a perspective view of a slider, a recording head, and a portion of a suspension.
Figure 2B:
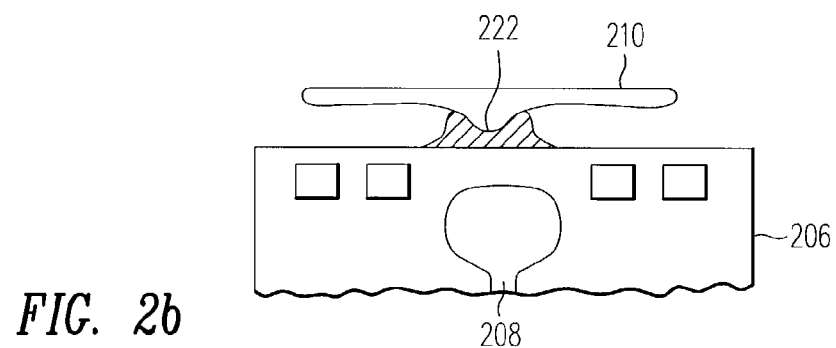
FIG. 2b illustrates an end view of a slider, a recording head, and a portion of a suspension.
Figure 2C:
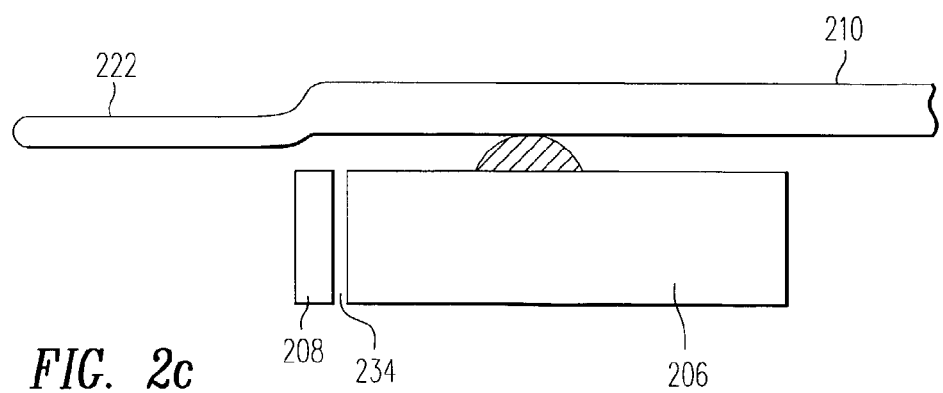
FIG. 2c illustrates a side view of a slider, a recording head, and a portion of a suspension.

FIG. 2a shows a more detailed perspective view of the slider 206 and a portion of the suspension 210. The recording head 208 is shown on the trailing surface of the slider 206. The load/unload tab 222 on the suspension 210 is illustrated. FIG. 2b shows an end view of the slider 206. FIG. 2c shows a side view of the slider 206, the suspension 210, the recording head 208, and the load/unload tab 222. FIG. 2c also shows that the recording head 208 is separated from the slider 206 by a thin layer of insulating material 234 such as alumina.

Figure 3:
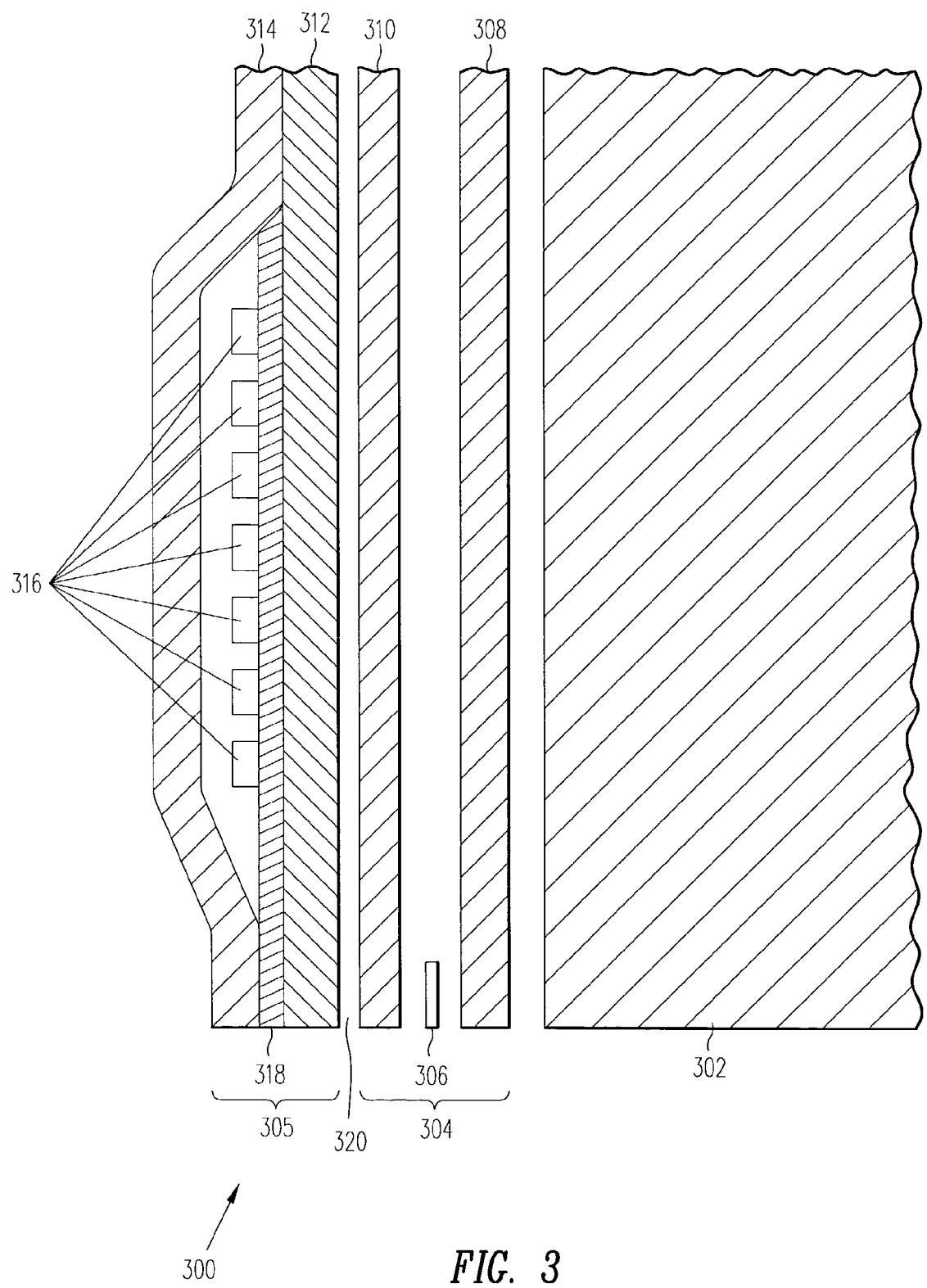
FIG. 3 illustrates a cross sectional view of a recording head.

A more detailed cross sectional view of a typical recording head is illustrated in FIG. 3. A recording head typically has a read element 304 having a sensor 306, leads (not shown), and shields 308, 310 near the sensor. A recording head typically also has a write element 305 having two poles 312, 314, a coil 316 and a gap layer 318. The write element 305 is usually separated from the read element 304 with a thin insulating layer 320. However, in some recording heads one pole 312 of the write element 305 and one shield 310 of the read element 304 are the same member. The recording head is constructed on a slider 302.

Figure 4:
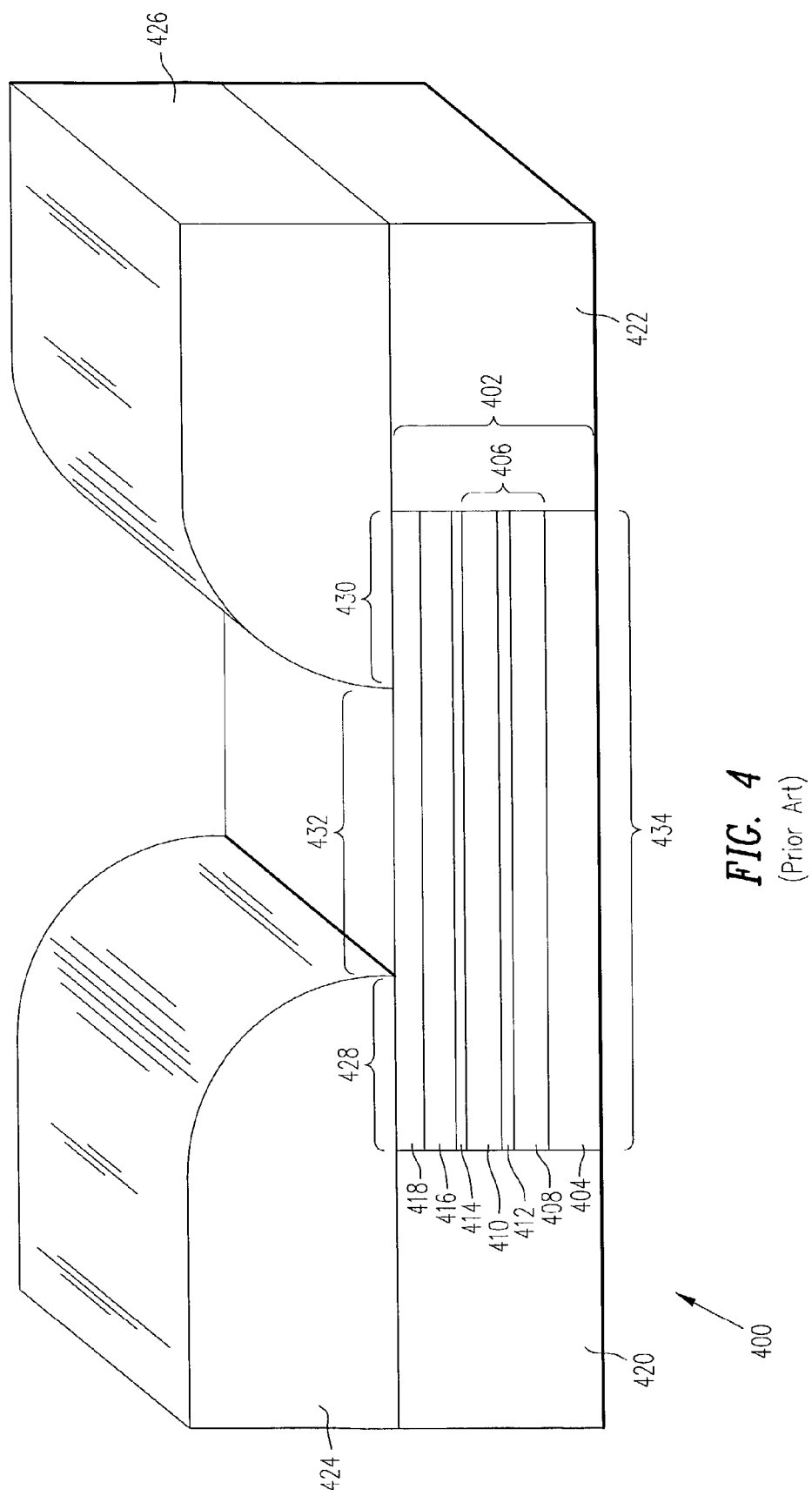
FIG. 4 illustrates a perspective view of a lead overlay read element.

FIG. 4 illustrates a typical prior art lead overlay read element 400. The sensor 402 in the read element 400 typically has an antiferromagnetic layer 404, a pinned structure 406 having first 408 and second 410 ferromagnetic layers separated by a thin nonmagnetic layer 412, a non-magnetic layer 414 separating the pinned structure 406 from a free layer 416. The uppermost layer 418, usually tantalum, in the sensor 402 is deposited to protect the other layers. The non-magnetic layer 414 can be formed from a conductor such as copper in a current-inplane (CIP) spin valve sensor. Spin valve sensors are also referred to as giant magnetoresistive (GMR) sensors. The non-magnetic layer 414 is usually formed from an insulator such as alumina in a current-perpendicular-to-plane (CPP) magnetic tunnel junction sensor. There may be additional layers in the sensor to enhance sensitivity, promote good adhesion, or further enhance performance. The features illustrated in FIG. 4 are not necessarily drawn to scale but rather intended to communicate the important features to one skilled in the art.

Again referring to FIG. 4, the read element 400 typically has two permanent magnets 420, 422 to provide magnetic biasing to the sensor 402. The read element 400 also has two electrical leads 424, 426 which overlay the end portions 428, 430 of the sensor 402. Ideally, the width of the sensor 432 which is not covered with a lead determines the magnetic trackwidth. However, if the tantalum layer 418 forms an oxide then the electrical resistance between the tantalum layer 418 and the leads 424, 426 increases significantly. In this instance, the current flow is through the entire sensor with significant current even in the permanent magnets 420, 422. The magnetic trackwidth can then be as wide as the physical width of the sensor 434 and can be significantly wider than the intended magnetic trackwidth.

Figure 5A:
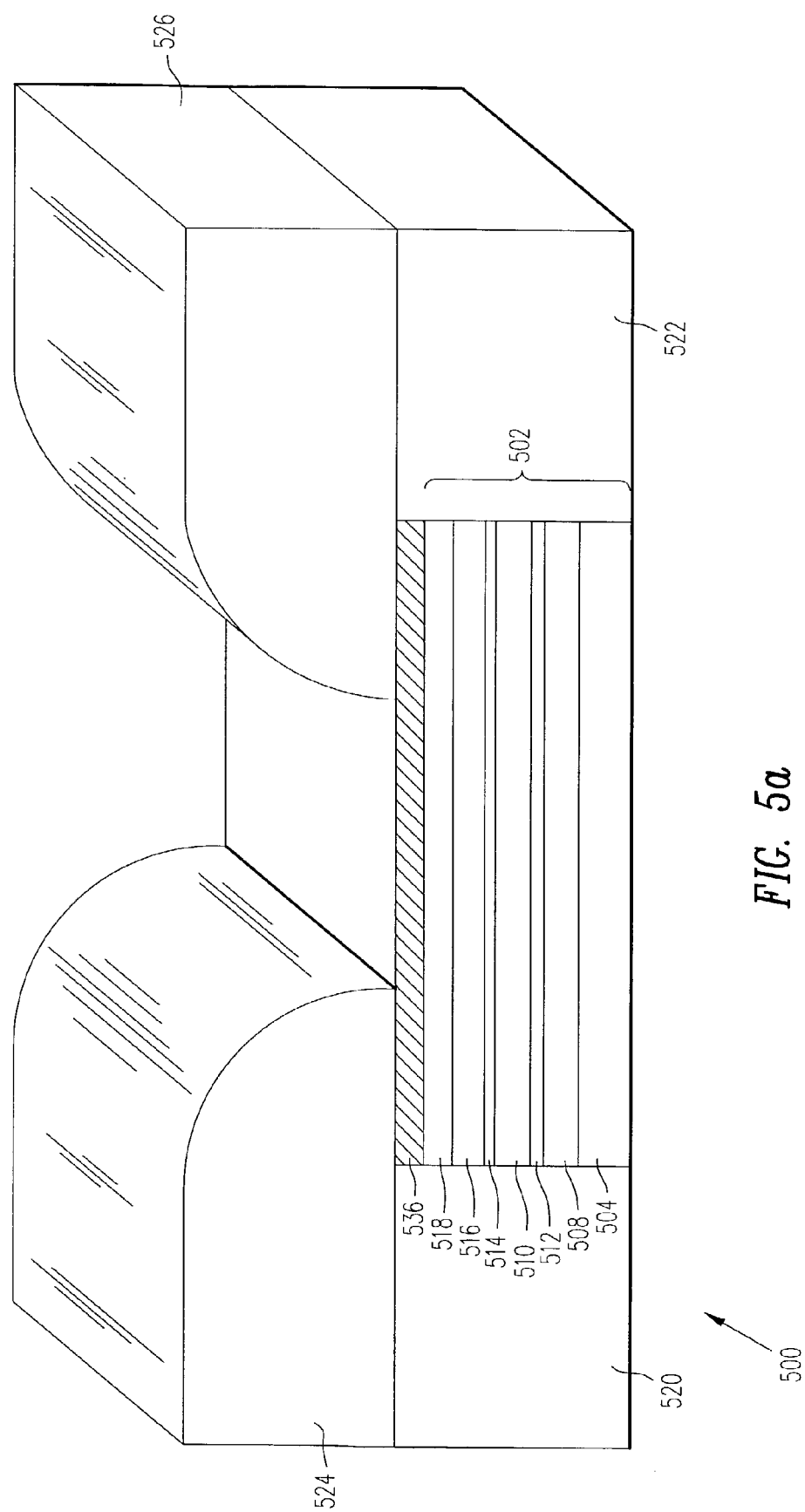
FIG. 5a illustrates a perspective view of a lead overlay read element having a protective cap disposed between the leads and the sensor; and, FIG. 5b illustrates a perspective view of a lead overlay read element having a portion of the protective cap removed.

FIG. 5a illustrates an exemplary read element 500 having one embodiment of the invention. The read element 500 has a sensor 502 with a sandwich of layers similar to the sensor illustrated in FIG. 4. There is an optional antiferromagnetic layer 504, two ferromagnetic layers 508, 510 separated by a thin nonmagnetic layer 512, a non-magnetic layer 514, a free layer 516, and a tantalum layer 518. The read element 500 also has permanent magnets 520, 522 and electrical leads 524, 526 that overlay the ends of the sensor. In addition to other features, the read element 500 has a protective cap layer 536 formed over the sensor 502. The protective cap layer 536 is disposed between the sensor 502 and the leads 524, 526. The material for the protective cap layer is preferably electrically conductive but nonmagnetic. The protective cap layer is preferably formed from ruthenium. Rhodium, copper, gold, platinum, or other materials resistant to oxidation or forming a benign (conductive) oxide may also be used. The cap layer may be deposited using any convenient sputtering or deposition process. The protective cap layer 536 protects the tantalum layer 518 against oxidation during subsequent processing and handling of the read element. Accordingly, the resistance between the leads 524, 526 and the sensor 502 is low.

Figure 5B:
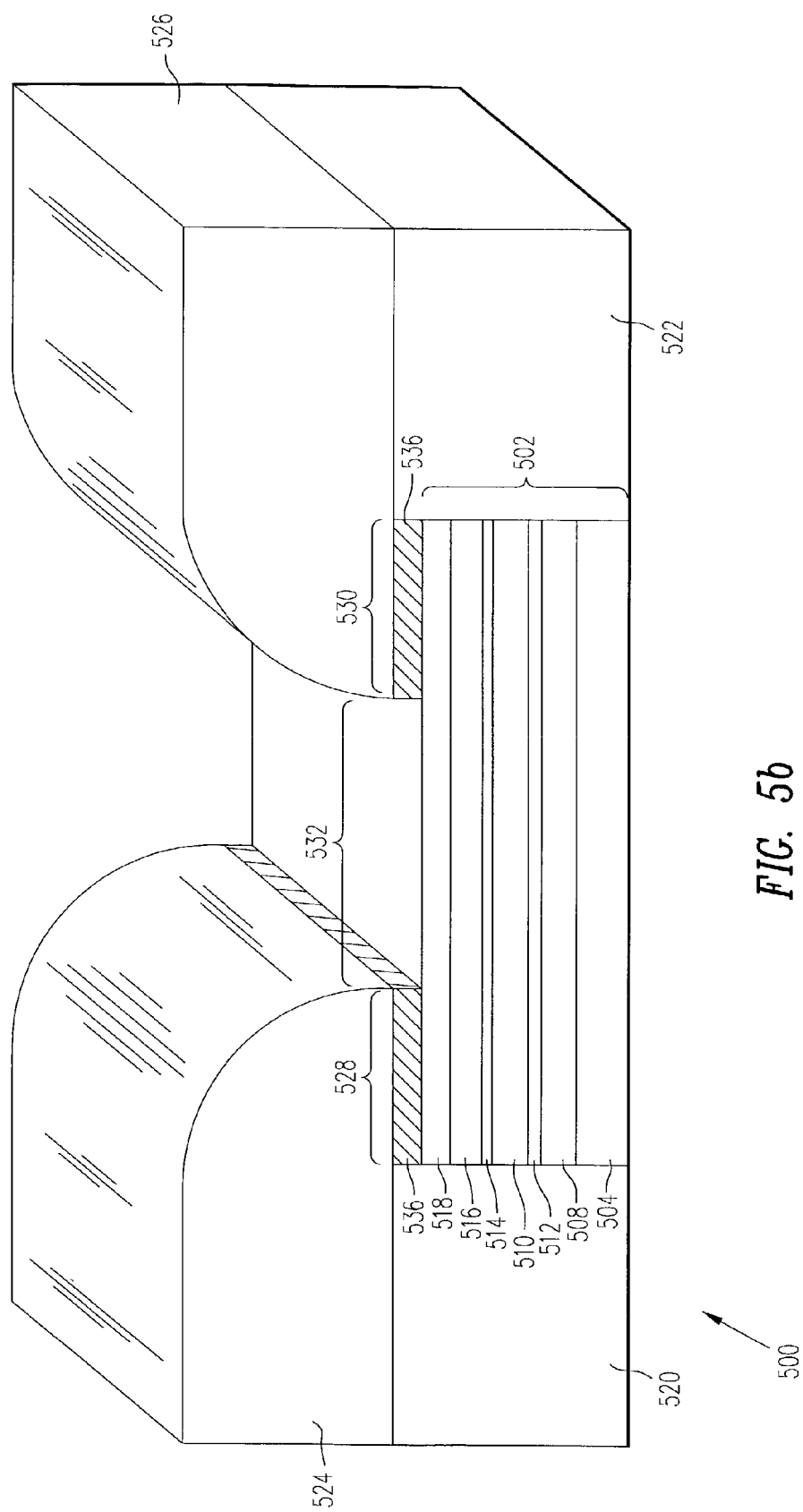

As discussed in more detail below, the preferred thickness of the protective cap layer (536 in FIG. 5a) is relatively thin. Thus, the current carrying capability in the plane of the protective cap layer is rather limited. Since the protective cap layer (536 in FIG. 5a) is electrically in parallel with the sensor, it is possible to shunt some current away from the sensor resulting in a loss of sensitivity. For protective cap layers having a thickness of about 20 Å, current shunting has not been observed to be a problem. However, current shunting through the protective cap layer can be completely avoided by exposing the read element to an ion milling step. The results of performing such an ion milling step is illustrated in FIG. 5b. The portion of the protective cap layer 536 over the central, magnetically active, portion 532 of the sensor 502, has been removed. Accordingly, there is no current shunting for the read element illustrated in FIG. 5b. The portions 528, 530 of the protective cap layer 536 disposed between the leads 524, 526 and the ends of the sensor 502 remain after ion milling and thus continue to provide low resistance and prevent oxidation.

Preferably, the protective cap layer is thick enough to protect the tantalum layer against oxidation and thin enough to have minimal effect on current shunting. A protective cap thickness of 10 Å was found to be effective in reducing resistance and magnetic trackwidth. A protective cap thickness of 20 Å was found to be very effective. For example, one set of experiments was performed comparing a group of sensors having a ruthenium protective cap layer of 20 Å thickness with a group of sensors having no protective cap layer. The group of sensors having no protective cap layer had an average resistance of 74 ohms and the group having the 20 Å protective cap layer had an average resistance of 54 ohms. Thus, the presence of the protective cap layer caused a resistance decrease of 20 ohms. Also, the average trackwidth was 0.03 µm narrower for the group of sensors having the protective cap layer. Thus, the optimum thickness of the protective cap layer should be at least 10 Å. The thickness may be substantially greater, however, removal of the protective cap layer over the active portion of the magnetic sensor as previously described may be required to prevent current shunting.

From the foregoing, it will be appreciated that the protective cap of the invention enables a lead overlay read element to have low resistance and a well defined magnetic trackwidth. The present invention also prevents the deleterious formation of oxide layers on the sensor. Although specific embodiments of the invention have been described and illustrated in detail, the invention is not to be limited to the specific forms thus described. The invention is limited only by the claims.

We claim:

1. A lead overlay magnetic sensor, comprising:
a sensor stack having a first end, a second end and a central region disposed between the first end and the second end;
a first lead disposed over said first end;
a second lead disposed over said second end; and
a protective cap layer overlying the sensor stack including the first and second ends and the central region;
wherein said protective cap layer is a single layer of a nonmagnetic electrically conductive material disposed between said sensor stack and said first and second leads;
a second cap layer overlying the sensor stack including the first and second ends and the central region, the second cap layer being positioned between the sensor stack and the protective cap layer, wherein said second cap layer is a single layer of an electrically conductive material.

2. A lead overlay magnetic sensor as in claim 1 wherein said protective cap layer is greater than 10 Å in thickness and less than about 20 Å in thickness.

3. A lead overlay magnetic sensor as in claim 1 wherein said protective cap layer is made of ruthenium.

4. A lead overlay magnetic sensor as in claim 1 wherein said protective cap layer is selected from the group of materials consisting of ruthenium, rhodium, copper, gold, and platinum.

5. A lead overlay magnetic sensor as in claim 1 wherein said sensor is a spin valve sensor.

6. A lead overlay magnetic sensor as in claim 1 wherein said sensor is a magnetic tunnel junction sensor.

7. A lead overlay magnetic sensor as in claim 1 wherein said sensor is magnetically stabilized with permanent magnets.

8. A disk drive, comprising:
a disk;
a magnetic sensor for reading information from said disk, said sensor further comprising:
a sensor stack having a first end, a second end and a central region disposed between the first end and the second end;
a first lead disposed over said first end;
a second lead disposed over said second end;
a protective cap layer overlying the sensor stack including the first and second ends and the central region; and
a second cap layer overlying the sensor stack including the first and second ends and the central region, the second cap layer being positioned between the sensor stack and the protective cap layer, wherein said second cap layer is a single layer of an electrically conductive material;
wherein said protective cap layer is single layer of nonmagnetic electrically conductive material disposed between said sensor stack and said first and second leads,
wherein said protective cap layer is less than about 20 Å in thickness.

9. A disk drive as in claim 8 wherein said protective cap layer is greater than 10 Å in thickness.

10. A disk drive as in claim 8 wherein said protective cap layer is made of ruthenium.

11. A disk drive as in claim 8 wherein said protective cap layer is selected from the group of materials consisting of ruthenium, rhodium, copper, gold, and platinum.

12. A disk drive as in claim 8 wherein said sensor is a spin valve sensor.

13. A disk drive as in claim 8 wherein said sensor is a magnetic tunnel junction sensor.

14. A disk drive as in claim 8 wherein said sensor is magnetically stabilized with permanent magnets.

15. A lead overlay magnetic sensor, comprising:
a sensor stack having a first end, a second end and a central region disposed between the first end and the second end, the sensor stack comprising:
a sensing layer for sensing magnetic signal fields;
a cap layer deposited uppermost over said sensing layer for protecting the sensing layer, wherein the cap layer overlies the first and second ends and the central region of the sensor stack;
a first lead disposed over the first end of the sensor stack;
a second lead disposed over the second end of the sensor stack; and
a nonmagnetic electrically conductive protective cap layer overlying the sensor stack including the first and second ends and the central region, wherein said protective cap layer is disposed between the cap layer of said sensor stack and said first and second leads,
wherein said protective cap layer is greater than 10 Å and less than about 20 Å in thickness.

16. A lead overlay magnetic sensor as in claim 15 wherein said cap layer is made of tantalum.

17. A lead overlay magnetic sensor as in claim 15 wherein said protective cap layer is made of ruthenium.

18. A lead overlay magnetic sensor as in claim 15 wherein said protective cap layer is selected from the group of materials consisting of ruthenium, rhodium, copper, gold, and platinum.

19. A lead overlay magnetic sensor as in claim 15 wherein said sensor is a spin valve sensor.

20. A lead overlay magnetic sensor as in claim 15 wherein said sensor is a magnetic tunnel junction sensor.

21. A lead overlay magnetic sensor as in claim 15 wherein said protective cap layer is constructed of a material forming a benign oxide upon oxidation.

* * * * *